US012628470B2

(12) United States Patent
 Feng

(10) Patent No.: US 12,628,470 B2
(45) Date of Patent: May 12, 2026

(54) LIGHT-EMITTING DIODE EPITAXIAL STRUCTURE AND MANUFACTURING METHOD THEREOF, AND LIGHT-EMITTING DIODE DEVICE

(71) Applicant: CHONGQING KONKA PHOTOELECTRIC TECHNOLOGY RESEARCH INSTITUTE CO., LTD., Chongqing (CN)

(72) Inventor: Zhongshan Feng, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 838 days.

(21) Appl. No.: 17/971,001

(22) Filed: Oct. 21, 2022

(65) Prior Publication Data

US 2023/0040400 A1 Feb. 9, 2023

Related U.S. Application Data

(63) Continuation of application No. PCT/CN2021/108642, filed on Jul. 27, 2021.

(51) Int. Cl.
 *H10H 20/816* (2025.01)
 *H10H 20/01* (2025.01)
 (Continued)

(52) U.S. Cl.
 CPC ...... *H10H 20/8162* (2025.01); *H10H 20/013* (2025.01); *H10H 20/812* (2025.01); *H10H 20/8242* (2025.01)

(58) Field of Classification Search
 CPC ............. H10H 20/8162; H10H 20/013; H10H 20/812; H10H 20/8242; H10H 20/824; H10H 20/01; H10H 20/817
 See application file for complete search history.

(56) References Cited

U.S. PATENT DOCUMENTS 6,201,264 B1     3/2001   Khare et al.
6,298,077 B1 *  10/2001   He ........................... H01S 5/20
                                              372/45.01

(Continued)

FOREIGN PATENT DOCUMENTS

CN         1655369 A  *  8/2005

OTHER PUBLICATIONS

CN 1655369 A—English (Year: 2005).*

(Continued)

*Primary Examiner* — Yara B Green
*Assistant Examiner* — Akhee Sarker-Nag
(74) *Attorney, Agent, or Firm* — HAUPTMAN HAM, LLP

(57) ABSTRACT

A light-emitting diode (LED) epitaxial structure, an LED device, and a manufacturing method of an LED epitaxial structure are provided. The LED epitaxial structure 100 includes an n-type confinement layer 20, an n-type waveguide layer 30, a light-emitting layer 40, a p-type waveguide layer 50, and a p-type confinement layer 60 that are sequentially stacked. The p-type waveguide layer 50 includes a first p-type waveguide sub-layer 51, an electron blocking layer 52, and a second p-type waveguide sub-layer 53 that are sequentially stacked, where the first p-type waveguide sub-layer 51 is disposed closer to the light-emitting layer 40 than the second p-type waveguide sub-layer 53, and the electron blocking layer 52 includes at least one oxide layer of aluminum$_y$gallium$_{1-y}$arsenide ($Al_yGa_{1-y}As$) 521.

16 Claims, 5 Drawing Sheets

(51) Int. Cl.
H10H 20/812 (2025.01)
H10H 20/824 (2025.01)

(56) References Cited

U.S. PATENT DOCUMENTS

| | | | | |
|---|---|---|---|---|
| 6,829,273 B2 * | 12/2004 | Amano | ............... | H01S 5/34333 |
| | | | | 372/45.01 |
| 2007/0280322 A1 * | 12/2007 | Sato | .................... | H01S 5/18311 |
| | | | | 372/36 |
| 2008/0212636 A1 * | 9/2008 | Sato | ........................ | H01S 5/343 |
| | | | | 257/E33.001 |
| 2013/0299776 A1 * | 11/2013 | Nakamura | ........... | H10H 20/825 |
| | | | | 438/46 |
| 2017/0170360 A1 * | 6/2017 | Bour | ....................... | H10H 20/84 |

OTHER PUBLICATIONS

The International Search Report issued in corresponding International Application No. PCT/CN2021/108642, mailed Mar. 2, 2022.

* cited by examiner

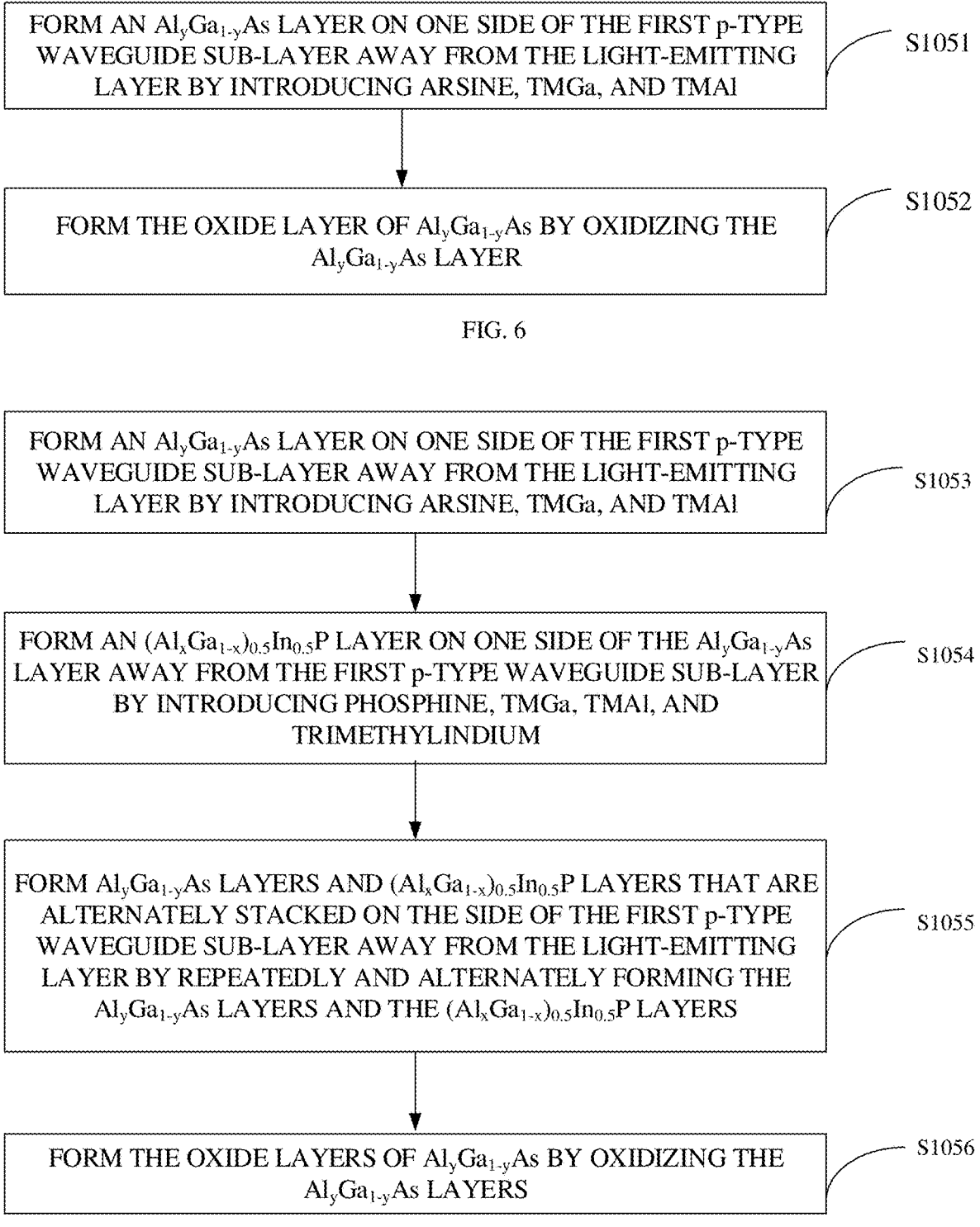

FORM AN $Al_yGa_{1-y}As$ LAYER ON ONE SIDE OF THE FIRST p-TYPE WAVEGUIDE SUB-LAYER AWAY FROM THE LIGHT-EMITTING LAYER BY INTRODUCING ARSINE, TMGa, AND TMAl — S1051

FORM THE OXIDE LAYER OF $Al_yGa_{1-y}As$ BY OXIDIZING THE $Al_yGa_{1-y}As$ LAYER — S1052

FIG. 6

FORM AN $Al_yGa_{1-y}As$ LAYER ON ONE SIDE OF THE FIRST p-TYPE WAVEGUIDE SUB-LAYER AWAY FROM THE LIGHT-EMITTING LAYER BY INTRODUCING ARSINE, TMGa, AND TMAl — S1053

FORM AN $(Al_xGa_{1-x})_{0.5}In_{0.5}P$ LAYER ON ONE SIDE OF THE $Al_yGa_{1-y}As$ LAYER AWAY FROM THE FIRST p-TYPE WAVEGUIDE SUB-LAYER BY INTRODUCING PHOSPHINE, TMGa, TMAl, AND TRIMETHYLINDIUM — S1054

FORM $Al_yGa_{1-y}As$ LAYERS AND $(Al_xGa_{1-x})_{0.5}In_{0.5}P$ LAYERS THAT ARE ALTERNATELY STACKED ON THE SIDE OF THE FIRST p-TYPE WAVEGUIDE SUB-LAYER AWAY FROM THE LIGHT-EMITTING LAYER BY REPEATEDLY AND ALTERNATELY FORMING THE $Al_yGa_{1-y}As$ LAYERS AND THE $(Al_xGa_{1-x})_{0.5}In_{0.5}P$ LAYERS — S1055

FORM THE OXIDE LAYERS OF $Al_yGa_{1-y}As$ BY OXIDIZING THE $Al_yGa_{1-y}As$ LAYERS — S1056

FIG. 7

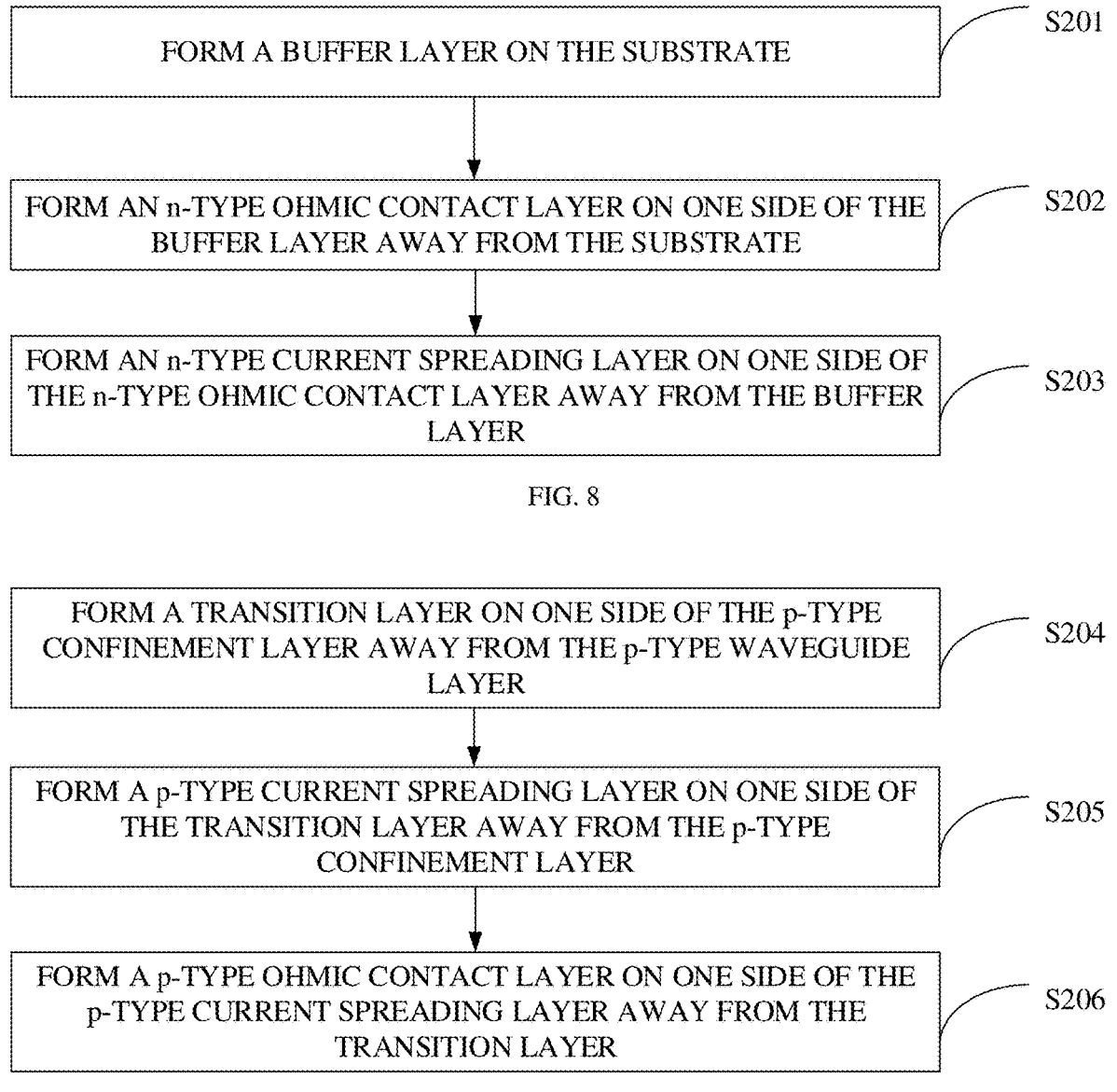

FORM A BUFFER LAYER ON THE SUBSTRATE — S201

FORM AN n-TYPE OHMIC CONTACT LAYER ON ONE SIDE OF THE BUFFER LAYER AWAY FROM THE SUBSTRATE — S202

FORM AN n-TYPE CURRENT SPREADING LAYER ON ONE SIDE OF THE n-TYPE OHMIC CONTACT LAYER AWAY FROM THE BUFFER LAYER — S203

FIG. 8

FORM A TRANSITION LAYER ON ONE SIDE OF THE p-TYPE CONFINEMENT LAYER AWAY FROM THE p-TYPE WAVEGUIDE LAYER — S204

FORM A p-TYPE CURRENT SPREADING LAYER ON ONE SIDE OF THE TRANSITION LAYER AWAY FROM THE p-TYPE CONFINEMENT LAYER — S205

FORM A p-TYPE OHMIC CONTACT LAYER ON ONE SIDE OF THE p-TYPE CURRENT SPREADING LAYER AWAY FROM THE TRANSITION LAYER — S206

FIG. 9

LIGHT-EMITTING DIODE EPITAXIAL STRUCTURE AND MANUFACTURING METHOD THEREOF, AND LIGHT-EMITTING DIODE DEVICE

CROSS-REFERENCE TO RELATED APPLICATION(S)

This application is a continuation of International Application No. PCT/CN2021/108642, filed Jul. 27, 2021, the entire disclosure of which is hereby incorporated by reference.

TECHNICAL FIELD

This application relates to the field of semiconductor light-emitting technology, and more particularly to a light-emitting diode (LED) epitaxial structure and a manufacturing method thereof, and an LED device.

BACKGROUND

Light-emitting diode (LED) devices have been widely used in various fields such as display technology, signal lights, interior and exterior indicators for vehicles, traffic lights, phones, electronic instruments, indoor and outdoor display, information processing, and communication, because of advantages such as low power consumption, small size, long life, low drive voltage, durability, and good monochromaticity.

A red-light LED device includes an epitaxial structure. For blocking overflow of electrons from a light-emitting layer in the epitaxial structure, increasing a probability of radiative recombination between the electrons and holes in the light-emitting layer, and further increasing light-emitting efficiency of the red-light LED device, generally, an electron blocking layer is disposed in the epitaxial structure. Traditionally, the electron blocking layer is made of aluminumx-indium$_{1-x}$phosphorus ($Al_xIn_{1-x}P$), where the $Al_xIn_{1-x}P$ is confined by lattice matching, and x generally ranges from 0.45 to 0.55, such that a band gap of the $Al_xIn_{1-x}P$ is narrower, an energy level difference between the electron blocking layer and the light-emitting layer is lower, and an electron blocking effect is worse, and thus causing problems of the red-light LED device such as sharply decreased light-emitting efficiency, a low reverse-bias resistant property, and a poor antistatic ability. Even though a thickness of the $Al_xIn_{1-x}P$ of the electron blocking layer is increased, the electron blocking effect is limitedly improved, and in addition, increase of the thickness of the electron blocking layer may decrease an electrical property of the red-light LED device.

SUMMARY

An LED epitaxial structure is provided. The LED epitaxial structure includes an n-type confinement layer, an n-type waveguide layer, a light-emitting layer, a p-type waveguide layer, and a p-type confinement layer that are sequentially stacked. The p-type waveguide layer includes a first p-type waveguide sub-layer, an electron blocking layer, and a second p-type waveguide sub-layer that are sequentially stacked, where the first p-type waveguide sub-layer is disposed closer to the light-emitting layer than the second p-type waveguide sub-layer, and the electron blocking layer includes at least one oxide layer of aluminum$_y$ gallium$_{1-y}$arsenide ($Al_yGa_{1-y}As$).

An LED device is further provided in the disclosure. The LED device includes an n electrode, a p electrode, and the above LED epitaxial structure, where the n electrode is electrically coupled with the n-type confinement layer, and the p electrode is electrically coupled with the p-type confinement layer.

A manufacturing method of an LED epitaxial structure is further provided in the disclosure. The manufacturing method of an LED epitaxial structure includes the following. A substrate is provided. An n-type confinement layer is formed on the substrate. An n-type waveguide layer is formed on one side of the n-type confinement layer away from the substrate. A light-emitting layer is formed on one side of the n-type waveguide layer away from the n-type confinement layer. A p-type waveguide layer is formed on one side of the light-emitting layer away from the n-type waveguide layer. The p-type waveguide layer is formed as follows. A first p-type waveguide sub-layer, an electron blocking layer, and a second p-type waveguide sub-layer that are sequentially stacked are formed on one side of the light-emitting layer away from the n-type waveguide layer. The electron blocking layer includes at least one oxide layer of $Al_yGa_{1-y}As$. A p-type confinement layer is formed on one side of the p-type waveguide layer away from the light-emitting layer.

BRIEF DESCRIPTION OF THE DRAWINGS

In order to describe technical solutions in implementations of the disclosure more clearly, the following will give a brief introduction to the accompanying drawings required in implementations. Apparently, the accompanying drawings hereinafter described are some implementations of the disclosure. Based on these drawings, those of ordinary skill in the art can also obtain other drawings without creative effort.

FIG. 6 is a flow chart illustrating a forming method of an electron blocking layer provided in implementations of the disclosure.

FIG. 7 is a flow chart illustrating a forming method of an electron blocking layer provided in another implementation of the disclosure.

FIG. 8 is a flow chart illustrating a manufacturing method of an LED epitaxial structure provided in another implementation of the disclosure.

FIG. 9 is a flow chart illustrating a manufacturing method of an LED epitaxial structure provided in yet another implementation of the disclosure.

Figure 1:
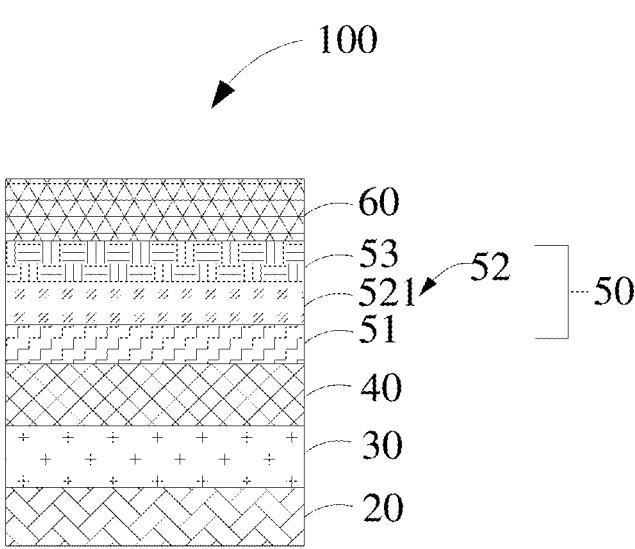
FIG. 1 is a schematic cross-sectional structural diagram illustrating a light-emitting diode (LED) epitaxial structure provided in implementations of the disclosure.

Description of reference signs of the accompanying drawings: 100—LED epitaxial structure; 20—n-type confinement layer; 30—n-type waveguide layer; 40—light-emitting layer; 50—p-type waveguide layer; 51—first p-type waveguide sub-layer; 52—electron blocking layer; 521—oxide layer of aluminum$_y$gallium$_{1-y}$arsenide (Al$_y$Ga$_{1-y}$As); 522—(aluminum$_x$gallium$_{1-x}$)$_{0.5}$indium$_{0.5}$phosphorus ((Al$_x$Ga$_{1-x}$)$_{0.5}$In$_{0.5}$P) layer; 53—second p-type waveguide sub-layer; 60—p-type confinement layer; 11—buffer layer; 12—n-type ohmic contact layer; 13—n-type current spreading layer; 70—transition layer; 80—p-type current spreading layer; 90—p-type ohmic contact layer.

DETAILED DESCRIPTION

In order to facilitate understanding of the disclosure, a detailed description will be given with reference to relevant accompanying drawings. The accompanying drawings illustrate some exemplary implementations of the disclosure. However, the disclosure can be implemented in many different forms and is not limited to the implementations described herein. On the contrary, these implementations are provided for a more thorough and comprehensive understanding of the disclosure.

Unless otherwise defined, all technical and scientific terms used herein have the same meaning as commonly understood by those skilled in the art of the disclosure. The terms used herein in the disclosure are for the purpose of describing implementations only and are not intended to limit the disclosure.

The terms "first", "second", and the like used in the specification of the disclosure are used to distinguish different objects rather than describe a particular order. In addition, locations or positional relationships indicated by terms such as "on", "in", "out", and the like are locations or positional relationships based on accompanying drawings and are only for the convenience of description and to simplify the description, rather than explicitly or implicitly indicate that apparatuses or components referred to herein must have a certain location or be configured or operated in a certain location and therefore cannot be understood as limitation on the disclosure.

It should be noted that the drawings provided in implementations of the disclosure illustrate the basic concept of the disclosure only in a schematic way, and only the components related to the disclosure are illustrated in the drawings, instead of being drawn according to the number, shapes, and sizes of the components in actual implementations. The types, number, and proportions of each component in actual implementations can be arbitrarily changed, and the layout of the components may be more complicated.

In view of the above deficiencies of the related art, the disclosure provides a light-emitting diode (LED) epitaxial structure, an LED device, and a manufacturing method of an LED epitaxial structure, which aims to effectively improve an electron blocking effect of an electron blocking layer, and thereby improving light-emitting efficiency, a reverse-bias resistant property, and an antistatic ability of the LED device.

An LED epitaxial structure is provided. The LED epitaxial structure includes an n-type confinement layer, an n-type waveguide layer, a light-emitting layer, a p-type waveguide layer, and a p-type confinement layer that are sequentially stacked. The p-type waveguide layer includes a first p-type waveguide sub-layer, an electron blocking layer, and a second p-type waveguide sub-layer that are sequentially stacked, where the first p-type waveguide sub-layer is disposed closer to the light-emitting layer than the second p-type waveguide sub-layer, and the electron blocking layer includes at least one oxide layer of aluminum$_y$gallium$_{1-y}$arsenide (Al$_y$Ga$_{1-y}$As).

The above LED epitaxial structure includes the oxide layer of Al$_y$Ga$_{1-y}$As, where an oxide of Al$_y$Ga$_{1-y}$As is a wide band material, such that an energy level difference between the electron blocking layer and the light-emitting layer is greater, and an electron blocking effect of the electron blocking layer can be effectively improved, thereby effectively improving light-emitting efficiency, a reverse-bias resistant property, and an antistatic ability of an LED device.

In some implementations, the oxide layer of Al$_y$Ga$_{1-y}$As has a thickness ranging from 0.5 nm to 5 nm.

In some implementations, the electron blocking layer includes at least two oxide layers of Al$_y$Ga$_{1-y}$As and at least one (aluminum$_x$gallium$_{1-x}$)$_{0.5}$indium$_{0.5}$phosphorus ((Al$_x$Ga$_{1-x}$)$_{0.5}$In$_{0.5}$P) layer that are stacked, and the (Al$_x$Ga$_{1-x}$)$_{0.5}$In$_{0.5}$P layer and the oxide layers of Al$_y$Ga$_{1-y}$As are alternately stacked, where the number of oxide layers of Al$_y$Ga$_{1-y}$As is one more than the number of (Al$_x$Ga$_{1-x}$)$_{0.5}$In$_{0.5}$P layers, and two layers among the at least two oxide layers of Al$_y$Ga$_{1-y}$As are respectively disposed close to the first p-type waveguide sub-layer and the second p-type waveguide sub-layer (in other words, one layer among the at least two oxide layers of Al$_y$Ga$_{1-y}$As is disposed close to the first p-type waveguide sub-layer and the other layer among the at least two oxide layers of Al$_y$Ga$_{1-y}$As is disposed close to the second p-type waveguide sub-layer).

In some implementations, the electron blocking layer includes 3 to 11 oxide layers of Al$_y$Ga$_{1-y}$As and 2 to 10 (Al$_x$Ga$_{1-x}$)$_{0.5}$In$_{0.5}$P layers.

In some implementations, a value of y of an oxide of Al$_y$Ga$_{1-y}$As satisfies $0.5 \leq y \leq 1.0$.

In some implementations, the oxide layer of Al$_y$Ga$_{1-y}$As includes an oxide of carbon-doped Al$_y$Ga$_{1-y}$As.

In some implementations, a value of x of (Al$_x$Ga$_{1-x}$)$_{0.5}$In$_{0.5}$P satisfies $0.5 \leq x \leq 1.0$.

Based on the same inventive concept, an LED device is further provided in the disclosure. The LED device includes an n electrode, a p electrode, and the above LED epitaxial structure, where the n electrode is electrically coupled with the n-type confinement layer, and the p electrode is electrically coupled with the p-type confinement layer.

Based on the same inventive concept, a manufacturing method of an LED epitaxial structure is further provided in the disclosure. The manufacturing method of an LED epitaxial structure includes the following. A substrate is provided. An n-type confinement layer is formed on the substrate. An n-type waveguide layer is formed on one side of the n-type confinement layer away from the substrate. A light-emitting layer is formed on one side of the n-type waveguide layer away from the n-type confinement layer. A p-type waveguide layer is formed on one side of the light-emitting layer away from the n-type waveguide layer. The p-type waveguide layer is formed as follows. A first p-type waveguide sub-layer, an electron blocking layer, and a second p-type waveguide sub-layer that are sequentially stacked are formed on one side of the light-emitting layer away from the n-type waveguide layer. The electron blocking layer includes at least one oxide layer of Al$_y$Ga$_{1-y}$As. A p-type confinement layer is formed on one side of the p-type waveguide layer away from the light-emitting layer.

According to the above manufacturing method of an LED epitaxial structure, the electron blocking layer is formed, and the electron blocking layer includes the oxide layer of Al$_y$Ga$_{1-y}$As, where an oxide of Al$_y$Ga$_{1-y}$As is a wide band material, such that an energy level difference between the electron blocking layer and the light-emitting layer is greater, and an electron blocking effect of the electron blocking layer can be effectively improved, thereby effectively improving light-emitting efficiency, a reverse-bias resistant property, and an antistatic ability of an LED device.

In some implementations, the electron blocking layer is formed as follows. An $Al_yGa_{1-y}As$ layer is formed on one side of the first p-type waveguide sub-layer away from the light-emitting layer by introducing arsine, trimethylgallium (TMGa), and trimethylaluminium (TMAl). The oxide layer of $Al_yGa_{1-y}As$ is formed by oxidizing the $Al_yGa_{1-y}As$ layer.

In some implementations, the $Al_yGa_{1-y}As$ layer is formed on the side of the first p-type waveguide sub-layer away from the light-emitting layer by introducing arsine, TMGa, and TMAl as follows. A carbon-doped $Al_yGa_{1-y}As$ layer is formed on the side of the first p-type waveguide sub-layer away from the light-emitting layer by introducing arsine, TMGa, TMAl, and a carbon precursor, where the carbon precursor includes tetrabromomethane or tetrachloromethane.

In some implementations, the electron blocking layer includes at least two oxide layers of $Al_yGa_{1-y}As$. The electron blocking layer is formed as follows. An $Al_yGa_{1-y}As$ layer is formed on one side of the first p-type waveguide sub-layer away from the light-emitting layer by introducing arsine, TMGa, and TMAl. An $(Al_xGa_{1-x})_{0.5}In_{0.5}P$ layer is formed on one side of the $Al_yGa_{1-y}As$ layer away from the first p-type waveguide sub-layer by introducing phosphine, TMGa, TMAl, and trimethylindium. $Al_yGa_{1-y}As$ layers and $(Al_xGa_{1-x})_{0.5}In_{0.5}P$ layers that are alternately stacked are formed on the side of the first p-type waveguide sub-layer away from the light-emitting layer by repeatedly and alternately forming the $Al_yGa_{1-y}As$ layers and the $(Al_xGa_{1-x})_{0.5}In_{0.5}P$ layers. The oxide layers of $Al_yGa_{1-y}As$ are formed by oxidizing the $Al_yGa_{1-y}As$ layers.

Referring to FIG. 1, FIG. 1 is a schematic cross-sectional structural diagram illustrating a light-emitting diode (LED) epitaxial structure 100 provided in implementations of the disclosure. As illustrated in FIG. 1, the LED epitaxial structure 100 includes an n-type confinement layer 20, an n-type waveguide layer 30, a light-emitting layer 40, a p-type waveguide layer 50, and a p-type confinement layer 60 that are sequentially stacked. The p-type waveguide layer 50 includes a first p-type waveguide sub-layer 51, an electron blocking layer 52, and a second p-type waveguide sub-layer 53 that are sequentially stacked, where the first p-type waveguide sub-layer 51 is disposed closer to the light-emitting layer 40 than the second p-type waveguide sub-layer 53, and the electron blocking layer 52 includes at least one oxide layer of $aluminum_ygallium_{1-y}arsenide$ $(Al_yGa_{1-y}As)$ 521 (or called oxide of $Al_yGa_{1-y}As$ layer).

The n-type confinement layer 20 may be an aluminum indium phosphorus (AlInP) layer, the p-type confinement layer 60 may be an AlInP layer, and each of the n-type confinement layer 20 and the p-type confinement layer 60 has a band gap (also called a width of forbidden band) greater than the light-emitting layer 40, such that holes and electrons can be confined in the light-emitting layer 40, and thus radiative recombination between the holes and the electrons can occur in the light-emitting layer 40.

The n-type waveguide layer 30 may be an $(aluminum_cgallium_{1-c})_{0.5}indium_{0.5}phosphorus$ $((Al_cGa_{1-c})_{0.5}In_{0.5}P)$ layer, where a value of c satisfies $0.5 \le c \le 1.0$. The n-type waveguide layer 30 has a refractive index lower than the light-emitting layer 40, such that total reflection of light beams emitted by the light-emitting layer 40 can occur at an intersection of the n-type waveguide layer 30 and the light-emitting layer 40, and thus the light beams can be intensively exited, thereby improving light extraction efficiency.

Each of the first p-type waveguide sub-layer 51 and the second p-type waveguide sub-layer 53 includes an $(Al_xGa_{1-x})_{0.5}In_{0.5}P$ layer, where a value of x satisfies $0.5 \le x \le 1.0$. The first p-type waveguide sub-layer 51 has a refractive index lower than the light-emitting layer 40, such that total reflection of light beams emitted by the light-emitting layer 40 can occur at an intersection of the first p-type waveguide sub-layer 51 and the light-emitting layer 40, and thus the light beams can be intensively exited, thereby improving light extraction efficiency. In some implementations, $(Al_xGa_{1-x})_{0.5}In_{0.5}P$ is not-intentionally doped $(Al_xGa_{1-x})_{0.5}In_{0.5}P$. The not-intentionally doped $(Al_xGa_{1-x})_{0.5}In_{0.5}P$ has weak absorption of carriers, thereby improving light-emitting efficiency.

In the implementation, the light-emitting layer 40 may be a multiple quantum well (MQW) active layer, where the MQW active layer includes at least one potential barrier layer and at least one potential well layer that are alternately stacked. In some implementations, the potential barrier layer may be an $(Al_pGa_{1-p})_{0.5}In_{0.5}P$ layer, and the potential well layer may be an $(Al_qGa_{1-q})_{0.5}In_{0.5}P$ layer. The potential barrier layer has a band gap greater than the potential well layer, such that electrons and holes are confined in the potential well layer, and thus radiative recombination can occur.

A value of y of an oxide of $Al_yGa_{1-y}As$ satisfies $0.5 \le y \le 1.0$.

The oxide layer of $Al_yGa_{1-y}As$ 521 has a thickness ranging from 0.5 nm to 5 nm. When the thickness of the oxide layer of $Al_yGa_{1-y}As$ 521 is lower than 0.5 nm, the electron blocking layer 52 has a limited electron blocking effect. When the thickness of the oxide layer of $Al_yGa_{1-y}As$ 521 is greater than 5 nm, the electron blocking layer 52 may block injection of holes, thereby decreasing light-emitting efficiency.

The oxide of $Al_yGa_{1-y}As$ includes aluminium oxide and gallium oxide, where the aluminium oxide has a wider band gap, such that an energy level difference between the electron blocking layer 52 and the light-emitting layer 40 can be effectively improved, thereby effectively blocking electrons from overflowing from the light-emitting layer 40.

The LED epitaxial structure provided in implementations of the disclosure includes the electron blocking layer 52, and the oxide of $Al_yGa_{1-y}As$ of the electron blocking layer 52 is a wide band material, such that an energy level difference between the electron blocking layer 52 and the light-emitting layer 40 is greater, and the electron blocking layer 52 can effectively block electrons from overflowing from the light-emitting layer 40, thereby improving light-emitting efficiency. Meanwhile, carriers pass through the oxide layer of $Al_yGa_{1-y}As$ 521 mainly through tunnel transition, which can conduct electricity by shielding defects and can also reduce a transient increase in current, thereby improving a reverse-bias resistant property and an antistatic ability of an LED device.

Figure 2:
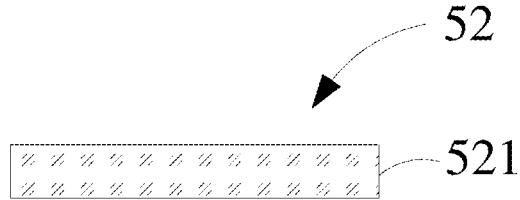
FIG. 2 is a schematic cross-sectional structural diagram illustrating an electron blocking layer provided in implementations of the disclosure.

Referring to FIG. 2, FIG. 2 is a schematic cross-sectional structural diagram illustrating an electron blocking layer 52 provided in implementations of the disclosure. As illustrated in FIG. 2, in some implementations, the electron blocking layer 52 includes one oxide layer of $Al_yGa_{1-y}As$ 521.

When the electron blocking layer 52 includes one oxide layer of $Al_yGa_{1-y}As$ 521, the oxide layer of $Al_yGa_{1-y}As$ 521 has a thickness ranging from 0.5 nm to 5 nm. The thickness of the oxide layer of $Al_yGa_{1-y}As$ 521 is a size of the oxide layer of $Al_yGa_{1-y}As$ 521 in a direction parallel to a stacking direction. When the thickness of the oxide layer of $Al_yGa_{1-y}As$ 521 is lower than 0.5 nm, the electron blocking layer 52 has a limited electron blocking effect. When the thickness of the oxide layer of $Al_yGa_{1-y}As$ 521 is greater than 5 nm, the electron blocking layer 52 may block holes from injecting into the light-emitting layer 40, thereby decreasing light-emitting efficiency.

Figure 3:
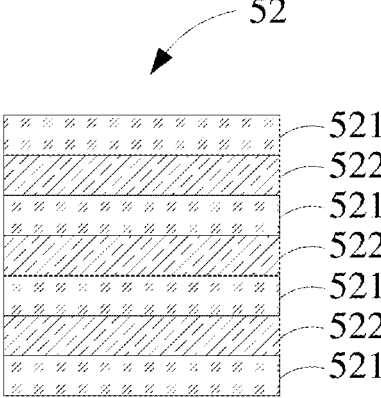
FIG. 3 is a schematic cross-sectional structural diagram illustrating an electron blocking layer provided in another implementation of the disclosure.

Referring to FIG. 3, FIG. 3 is a schematic cross-sectional structural diagram illustrating an electron blocking layer 52 provided in another implementation of the disclosure. As illustrated in FIG. 3, in some implementations, the electron blocking layer 52 includes at least two oxide layers of $Al_yGa_{1-y}As$ 521 and at least one $(Al_xGa_{1-x})_{0.5}In_{0.5}P$ layer 522 that are stacked, and the $(Al_xGa_{1-x})_{0.5}In_{0.5}P$ layer 522 and the oxide layers of $Al_yGa_{1-y}As$ 521 are alternately stacked, to form a super-lattice structure, where the number of oxide layers of $Al_yGa_{1-y}As$ 521 is one more than the number of $(Al_xGa_{1-x})_{0.5}In_{0.5}P$ layers 522.

When the electron blocking layer 52 includes at least two oxide layers of $Al_yGa_{1-y}As$ 521, each of the at least two oxide layers of $Al_yGa_{1-y}As$ 521 has a thickness ranging from 1 nm to 5 nm. The thickness of the oxide layer of $Al_yGa_{1-y}As$ 521 is a size of the oxide layer of $Al_yGa_{1-y}As$ 521 in a direction parallel to a stacking direction. When the thickness of the oxide layer of $Al_yGa_{1-y}As$ 521 is lower than 1 nm, the electron blocking layer 52 has a limited electron blocking effect. When the thickness of the oxide layer of $Al_yGa_{1-y}As$ 521 is greater than 5 nm, the electron blocking layer 52 may block injection of holes, thereby decreasing light-emitting efficiency.

A value of x of $(Al_xGa_{1-x})_{0.5}In_{0.5}P$ satisfies $0.5 \leq x \leq 1.0$.

In some implementations, the electron blocking layer 52 with the super-lattice structure includes 3 to 11 oxide layers of $Al_yGa_{1-y}As$ 521 and 2 to 10 $(Al_xGa_{1-x})_{0.5}In_{0.5}P$ layers 522. The number of oxide layers of $Al_yGa_{1-y}As$ 521 of the electron blocking layer 52 is one more than the number of $(Al_xGa_{1-x})_{0.5}In_{0.5}P$ layers 522 of the electron blocking layer 52.

By alternately stacking the $(Al_xGa_{1-x})_{0.5}In_{0.5}P$ layers 522 and the oxide layers of $Al_yGa_{1-y}As$ 521 to form the super-lattice structure, each $(Al_xGa_{1-x})_{0.5}In_{0.5}P$ layer 522 and an oxide layer of $Al_yGa_{1-y}As$ 521 adjacent to the $(Al_xGa_{1-x})_{0.5}In_{0.5}P$ layer 522 form a super-lattice period, and the electron blocking layer 52 includes 2 to 10 super-lattice periods. On condition that a thickness of each super-lattice period is unchanged, with increase of the number of super-lattice periods, the electron blocking layer 52 with the super-lattice structure has a more significant electron blocking effect. In specific applications, the number of super-lattice periods can be set according to an operating current density of an LED device. In addition, the super-lattice structure is conducive to spread of holes and uniform injection of holes, thereby improving a probability of effective recombination between holes and electrons, and thus improving light-emitting efficiency.

In some implementations, the oxide layer of $Al_yGa_{1-y}As$ 521 above includes an oxide of carbon-doped $Al_yGa_{1-y}As$.

The oxide of carbon-doped $Al_yGa_{1-y}As$ is formed, such that the electron blocking layer 52 including the oxide of carbon-doped $Al_yGa_{1-y}As$ can better realize hole transmission, thereby facilitating injection of holes into the light-emitting layer 40.

Figure 4:
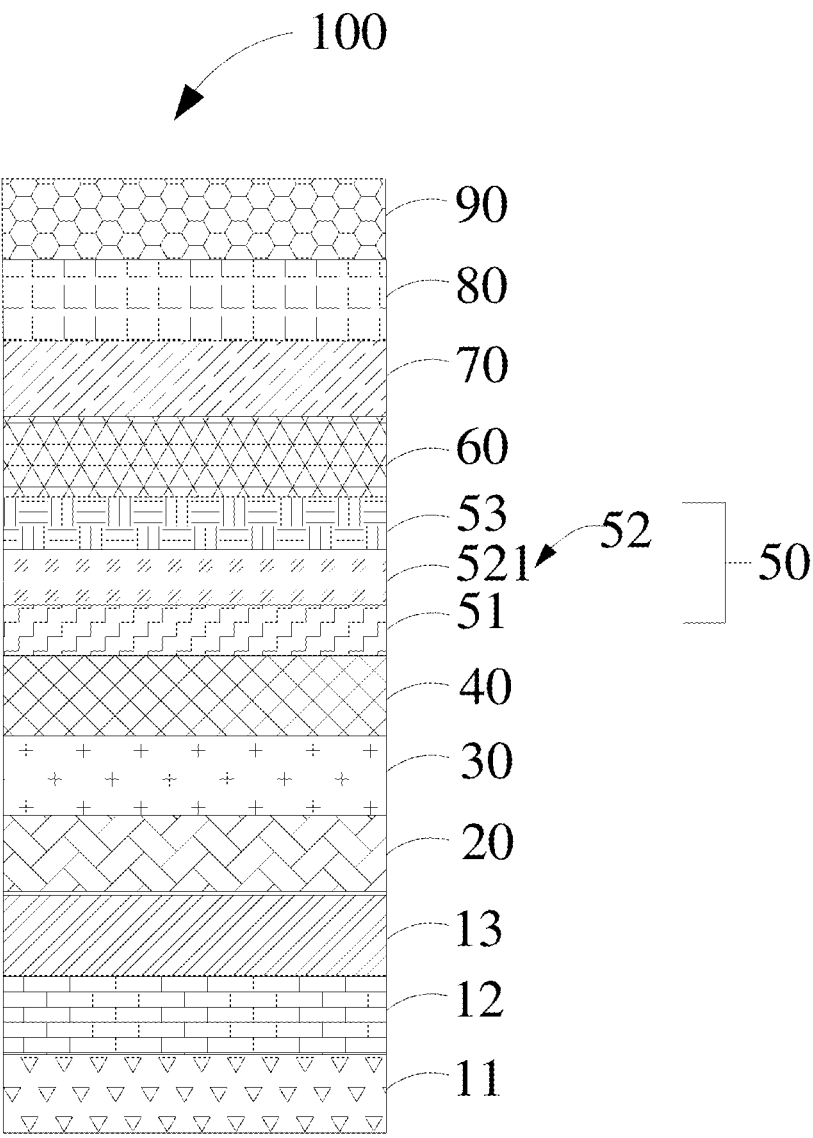
FIG. 4 is a schematic cross-sectional structural diagram illustrating an LED epitaxial structure provided in another implementation of the disclosure.

Referring to FIG. 4, FIG. 4 is a schematic cross-sectional structural diagram illustrating an LED epitaxial structure 100 provided in another implementation of the disclosure. As illustrated in FIG. 4, in some implementations, the LED epitaxial structure 100 further includes an n-type current spreading layer 13, an n-type ohmic contact layer 12, a buffer layer 11, a transition layer 70, a p-type current spreading layer 80, and a p-type ohmic contact layer 90. The n-type current spreading layer 13, the n-type ohmic contact layer 12, and the buffer layer 11 are sequentially stacked on one side of the n-type confinement layer 20 away from the n-type waveguide layer 30, and the transition layer 70, the p-type current spreading layer 80, and the p-type ohmic contact layer 90 are stacked on one side of the p-type confinement layer 60 away from the p-type waveguide layer 50.

The buffer layer 11 may be a GaAs layer, used to isolate and block impurities from entering into the n-type ohmic contact layer 12.

The n-type ohmic contact layer 12 may be an $(Al_aGa_{1-a})_{0.5}In_{0.5}P$ layer, used to form ohmic contact with an n electrode, where a value of a satisfies $0.3 \leq a \leq 0.6$.

The n-type current spreading layer 13 may be an $(Al_bGa_{1-b})_{0.5}In_{0.5}P$ layer, where a value of b satisfies $0.5 \leq b \leq 1.0$. When a current flows through the n-type current spreading layer 13 to the light-emitting layer 40, the n-type current spreading layer 13 can make a density of a current reaching the light-emitting layer 40 uniform, where uniform current distribution can improve light-emitting efficiency.

The p-type current spreading layer 80 may be a GaP layer, used to form ohmic contact with a p electrode.

The transition layer 70 may be an $(Al_f(Ga_{1-f})_{0.5}In_{0.5}P$ layer which is disposed between the p-type confinement layer 60 and the p-type current spreading layer 80 and functions as lattice transition, such that lattice mismatch between the p-type confinement layer 60 and the p-type current spreading layer 80 can be reduced, thereby reducing a defect density of the p-type current spreading layer 80.

The p-type ohmic contact layer 90 may be a GaP layer, used to form ohmic contact with a p electrode.

To sum up, according to the LED epitaxial structure provided in implementations of the disclosure, the electron blocking layer 52 is provided, and the electron blocking layer 52 includes the oxide layer of $Al_yGa_{1-y}A$ 521, where an oxide of $Al_yGa_{1-y}A$ is a wide band material, such that an energy level difference between the electron blocking layer 52 and the light-emitting layer 40 is greater, and overflowing of electrons from the light-emitting layer 40 can be effectively blocked, thereby effectively improving light-emitting efficiency, a reverse-bias resistant property, and an antistatic ability of an LED device.

An LED device is further provided in implementations of the disclosure. The LED device includes the LED epitaxial structure provided in any one of the foregoing implementations. The LED device further includes an n electrode and a p electrode, where the n electrode is electrically coupled with the n-type confinement layer 20, and the p electrode is electrically coupled with the p-type confinement layer 60.

Figure 5:
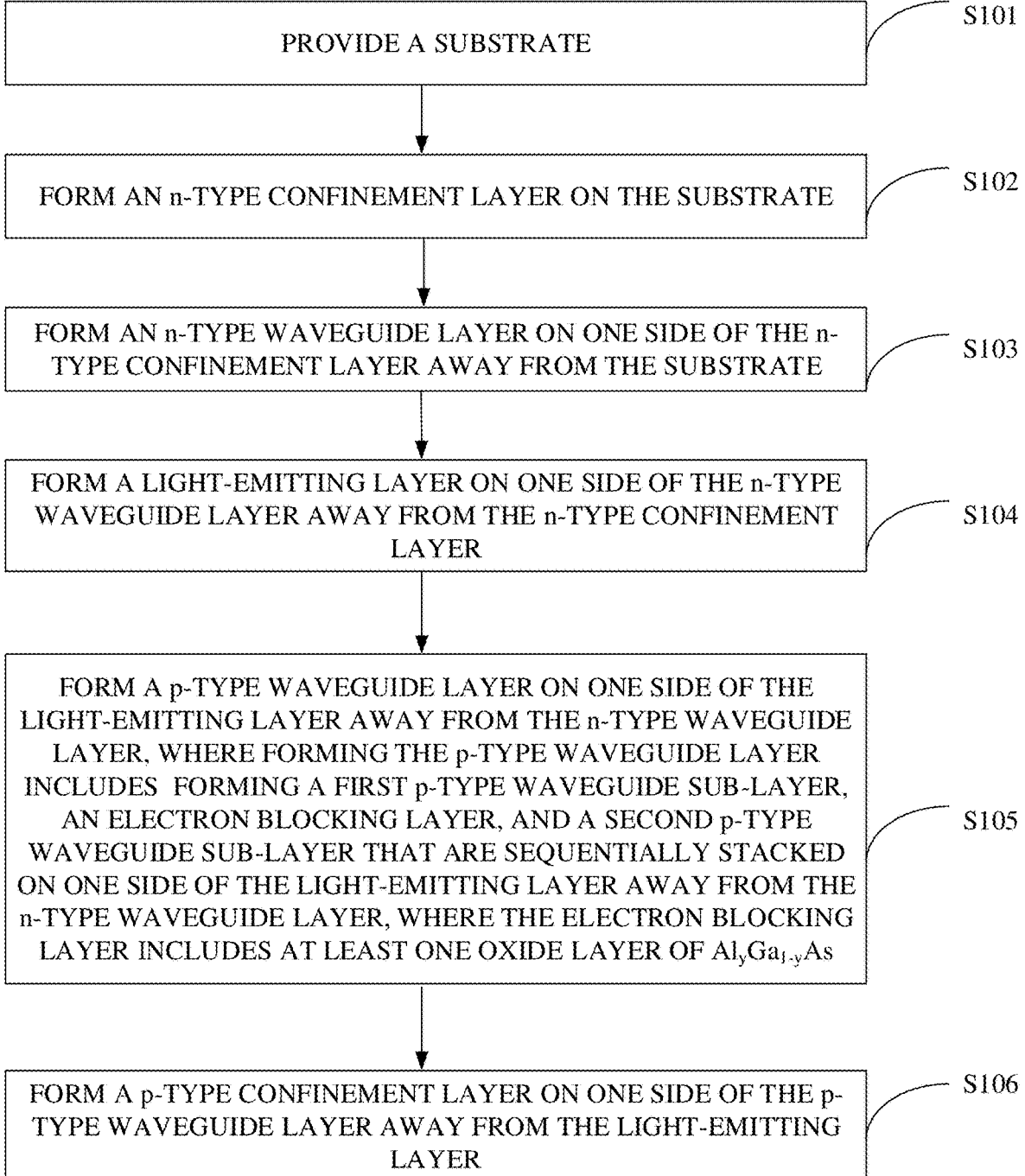
FIG. 5 is a flow chart illustrating a manufacturing method of an LED epitaxial structure provided in implementations of the disclosure.

Referring to FIG. 1 and FIG. 5 together, FIG. 5 is a flow chart illustrating a manufacturing method of an LED epitaxial structure provided in implementations of the disclosure, where the manufacturing method of an LED epitaxial structure is used to manufacture the LED epitaxial structure provided in any one of the foregoing implementations. As illustrated in FIG. 5, the manufacturing method of an LED epitaxial structure includes the following.

At S101, a substrate is provided.

At S102, an n-type confinement layer 20 is formed on the substrate.

At S103, an n-type waveguide layer 30 is formed on one side of the n-type confinement layer 20 away from the substrate.

At S104, a light-emitting layer 40 is formed on one side of the n-type waveguide layer 30 away from the n-type confinement layer 20.

At S105, a p-type waveguide layer 50 is formed on one side of the light-emitting layer 40 away from the n-type waveguide layer 30. The p-type waveguide layer 50 is formed as follows. A first p-type waveguide sub-layer 51, an electron blocking layer 52, and a second p-type waveguide sub-layer 53 that are sequentially stacked are formed on one side of the light-emitting layer 40 away from the n-type waveguide layer 30. The electron blocking layer 52 includes at least one oxide layer of $Al_yGa_{1-y}As$ 521.

At S106, a p-type confinement layer 60 is formed on one side of the p-type waveguide layer 50 away from the light-emitting layer 40.

According to the manufacturing method of an LED epitaxial structure provided in implementations of the disclosure, the electron blocking layer 52 is formed, and the electron blocking layer 52 includes the oxide layer of $Al_yGa_{1-y}As$ 521, where an oxide of $Al_yGa_{1-y}As$ is a wide band material, such that an energy level difference between the electron blocking layer 52 and the light-emitting layer 40 is greater, and overflowing of electrons from the light-emitting layer 40 can be effectively blocked, thereby effectively improving light-emitting efficiency, a reverse-bias resistant property, and an antistatic ability of an LED device.

The substrate may be made of GaAs, for providing a support for other film layers.

A value of y of the oxide of $Al_yGa_{1-y}As$ satisfies $0.5 \leq y \leq 1.0$.

The oxide layer of $Al_yGa_{1-y}As$ 521 has a thickness ranging from 0.5 nm to 5 nm. The thickness of the oxide layer of $Al_yGa_{1-y}As$ 521 is a size of the oxide layer of $Al_yGa_{1-y}As$ 521 in a direction parallel to a stacking direction. When the thickness of the oxide layer of $Al_yGa_{1-y}As$ 521 is lower than 0.5 nm, the electron blocking layer 52 has a limited electron blocking effect. When the thickness of the oxide layer of $Al_yGa_{1-y}As$ 521 is greater than 5 nm, the electron blocking layer 52 may block holes from injecting into the light-emitting layer 40, thereby decreasing light-emitting efficiency.

Referring to FIG. 2 and FIG. 6 together, FIG. 6 is a flow chart illustrating a forming method of an electron blocking layer 52 provided in implementations of the disclosure. As illustrated in FIG. 6, forming the electron blocking layer 52 includes the following.

At S1051, an $Al_yGa_{1-y}As$ layer is formed on one side of the first p-type waveguide sub-layer 51 away from the light-emitting layer 40 by introducing arsine, trimethylgallium (TMGa), and trimethylaluminium (TMAl).

At S1052, the oxide layer of $Al_yGa_{1-y}As$ 521 is formed by oxidizing the $Al_yGa_{1-y}As$ layer.

Thermal decomposition reaction of arsine, TMGa, and TMAl generates $Al_yGa_{1-y}As$, and an oxide of $Al_yGa_{1-y}As$ is generated by oxidizing the $Al_yGa_{1-y}As$. The oxide of $Al_yGa_{1-y}As$ includes aluminium oxide and gallium oxide, where the aluminium oxide has a wider band gap, such that an energy level difference between the electron blocking layer 52 and the light-emitting layer 40 can be effectively improved, thereby effectively blocking electrons from overflowing from the light-emitting layer 40. Meanwhile, carriers pass through the oxide layer of $Al_yGa_{1-y}As$ 521 mainly through tunnel transition, which can conduct electricity by shielding defects and can also reduce a transient increase in current, thereby improving a reverse-bias resistant property and an antistatic ability of an LED device.

When the electron blocking layer 52 includes one oxide layer of $Al_yGa_{1-y}As$ 521, the oxide layer of $Al_yGa_{1-y}As$ 521 has a thickness ranging from 0.5 nm to 5 nm. The thickness of the oxide layer of $Al_yGa_{1-y}As$ 521 is a size of the oxide layer of $Al_yGa_{1-y}As$ 521 in a direction parallel to a stacking direction. When the thickness of the oxide layer of $Al_yGa_{1-y}As$ 521 is lower than 0.5 nm, the electron blocking layer 52 has a limited electron blocking effect. When the thickness of the oxide layer of $Al_yGa_{1-y}As$ 521 is greater than 5 nm, the electron blocking layer 52 may block holes from injecting into the light-emitting layer 40, thereby decreasing light-emitting efficiency.

A condition for forming the $Al_yGa_{1-y}As$ layer includes a temperature ranging from 660° C. to 710° C., a pressure ranging from 50 mbar to 80 mbar, and V/III ranging from 20 to 50, where V/III is a ratio of a gas flow of a group V source to a gas flow of a group III source, the group V source includes arsine, and the group III source includes at least one of TMGa or TMAl. This condition is conducive to forming an $Al_yGa_{1-y}As$ layer with a uniform thickness.

The $Al_yGa_{1-y}As$ layer is oxidized. Specifically, oxygen or a mixed gas of water vapor and nitrogen is introduced, an oxidation temperature is controlled to be ranged from 400° C. to 500° C., and a gas flow of oxygen or a gas flow of water vapor is controlled to be ranged from 5 standard cubic centimeter per minute (sccm) to 20 sccm, to oxidize the $Al_yGa_{1-y}As$ layer. When the oxidation temperature is lower than 400° C., an oxidation rate is low, and a rate of forming an oxide of $Al_yGa_{1-y}As$ is low, thereby causing low production efficiency of an LED epitaxial structure. When the oxidation temperature is higher than 500° C., the LED epitaxial structure may be damaged. Under conditions that a temperature ranges from 400° C. to 500° C. and there is oxygen, Al and Ga in $Al_yGa_{1-y}As$ are easy to be oxidized to generate aluminium oxide and gallium oxide.

In other implementations, the electron blocking layer 52 is formed as follows. A carbon-doped $Al_yGa_{1-y}As$ layer is formed on the side of the first p-type waveguide sub-layer 51 away from the light-emitting layer 40 by introducing arsine, TMGa, TMAl, and a carbon precursor. An oxide layer of carbon-doped $Al_yGa_{1-y}As$ is formed by oxidizing the carbon-doped $Al_yGa_{1-y}As$ layer. The carbon precursor includes tetrabromomethane or tetrachloromethane.

The carbon-doped $Al_yGa_{1-y}As$ layer is formed by introducing the carbon precursor as a p-type dopant, and the oxide layer of carbon-doped $Al_yGa_{1-y}As$ is formed by oxidizing the carbon-doped $Al_yGa_{1-y}As$ layer, such that the electron blocking layer 52 including the oxide layer of carbon-doped $Al_yGa_{1-y}As$ can better realize hole transmission, thereby facilitating injection of holes into the light-emitting layer 40.

When the electron blocking layer 52 includes one oxide layer of carbon-doped $Al_yGa_{1-y}As$, the oxide layer of carbon-doped $Al_yGa_{1-y}As$ has a thickness ranging from 0.5 nm to 5 nm. The thickness of the oxide layer of carbon-doped $Al_yGa_{1-y}As$ is a size of the oxide layer of carbon-doped $Al_yGa_{1-y}As$ in a direction parallel to a stacking direction. When the thickness of the oxide layer of carbon-doped $Al_yGa_{1-y}As$ is lower than 0.5 nm, the electron blocking layer 52 has a limited electron blocking effect. When the thickness of the oxide layer of carbon-doped $Al_yGa_{1-y}As$ is greater than 5 nm, the electron blocking layer 52 may block holes from injecting into the light-emitting layer 40, thereby decreasing light-emitting efficiency.

A condition for forming the carbon-doped $Al_yGa_{1-y}As$ layer, such as temperature, pressure, and V/III, is the same as that for forming the $Al_yGa_{1-y}As$ layer foregoing, which will not be repeated herein.

Oxidation processing on the carbon-doped $Al_yGa_{1-y}As$ layer is the same as that on the $Al_yGa_{1-y}As$ layer foregoing, which will not be repeated herein.

Referring to FIG. 3 and FIG. 7 together, FIG. 7 is a flow chart illustrating a forming method of an electron blocking layer 52 provided in another implementation of the disclosure. As illustrated in FIG. 7, the electron blocking layer 52 includes at least two oxide layers of $Al_yGa_{1-y}As$ 521. The electron blocking layer 52 is formed as follows.

At S1053, an $Al_yGa_{1-y}As$ layer is formed on one side of the first p-type waveguide sub-layer 51 away from the light-emitting layer 40 by introducing arsine, TMGa, and TMAl.

At S1054, an $(Al_xGa_{1-x})_{0.5}In_{0.5}P$ layer 522 is formed on one side of the $Al_yGa_{1-y}As$ layer away from the first p-type waveguide sub-layer 51 by introducing phosphine, TMGa, TMAl, and trimethylindium.

At S1055, $Al_yGa_{1-y}As$ layers and $(Al_xGa_{1-x})_{0.5}In_{0.5}P$ layers 522 that are alternately stacked are formed on the side of the first p-type waveguide sub-layer 51 away from the light-emitting layer 40 by repeatedly and alternately forming the $Al_yGa_{1-y}As$ layers and the $(Al_xGa_{1-x})_{0.5}In_{0.5}P$ layers 522.

At S1056, the oxide layers of $Al_yGa_{1-y}As$ 521 are formed by oxidizing the $Al_yGa_{1-y}As$ layers.

By alternately forming the $(Al_xGa_{1-x})_{0.5}In_{0.5}P$ layers 522 and the oxide layers of $Al_yGa_{1-y}As$ 521 to form the super-lattice structure, each $(Al_xGa_{1-x})_{0.5}In_{0.5}P$ layer 522 and an oxide layer of $Al_yGa_{1-y}As$ 521 adjacent to the $(Al_xGa_{1-x})_{0.5}In_{0.5}P$ layer 522 form a super-lattice period. On condition that a thickness of each super-lattice period is unchanged, with increase of the number of super-lattice periods, the electron blocking layer 52 with the super-lattice structure has a more significant electron blocking effect. In specific applications, the number of super-lattice periods can be set according to an operating current density of an LED device. In addition, the super-lattice structure is conducive to spread of holes and uniform injection of holes into the light-emitting layer 40, thereby improving a probability of effective recombination between holes and electrons in the light-emitting layer 40, and thus improving light-emitting efficiency.

When the electron blocking layer 52 includes at least two oxide layers of $Al_yGa_{1-y}As$ 521, each of the at least two oxide layers of $Al_yGa_{1-y}As$ 521 has a thickness ranging from 1 nm to 5 nm. The thickness of the oxide layer of $Al_yGa_{1-y}As$ 521 is a size of the oxide layer of $Al_yGa_{1-y}As$ 521 in a direction parallel to a stacking direction. When the thickness of the oxide layer of $Al_yGa_{1-y}As$ 521 is lower than 1 nm, the electron blocking layer 52 has a limited electron blocking effect. When the thickness of the oxide layer of $Al_yGa_{1-y}As$ 521 is greater than 5 nm, the electron blocking layer 52 may block holes from injecting into the light-emitting layer 40, thereby decreasing light-emitting efficiency.

A value of x of $(Al_xGa_{1-x})_{0.5}In_{0.5}P$ satisfies $0.5 \leq x \leq 1.0$.

In some implementations, the electron blocking layer 52 includes 3 to 11 oxide layers of $Al_yGa_{1-y}As$ 521 and 2 to 10 $(Al_xGa_{1-x})_{0.5}In_{0.5}P$ layers 522. The number of oxide layers of $Al_yGa_{1-y}As$ 521 of the electron blocking layer 52 is one more than the number of $(Al_xGa_{1-x})_{0.5}In_{0.5}P$ layers 522 of the electron blocking layer 52. When the number of oxide layers of $Al_yGa_{1-y}As$ 521 of the electron blocking layer 52 is less than 3, the electron blocking layer 52 has a limited electron blocking effect. When the number of oxide layers of $Al_yGa_{1-y}As$ 521 of the electron blocking layer 52 is greater than 11, the electron blocking layer 52 may block holes from injecting into the light-emitting layer 40, thereby decreasing light-emitting efficiency.

A condition for forming the $Al_yGa_{1-y}As$ layer herein, such as temperature, pressure, and V/III, is the same as that for forming the $Al_yGa_{1-y}As$ layer foregoing, which will not be repeated herein.

A condition for forming the $(Al_xGa_{1-x})_{0.5}In_{0.5}P$ layer 522 includes a temperature ranging from 680° C. to 730° C., a pressure ranging from 50 mbar to 80 mbar, and V/III ranging from 75 to 150, where V/III is a ratio of a gas flow of a group V source to a gas flow of a group III source, the group V source includes phosphine, and the group III source includes at least one of TMGa, TMAl, or trimethylindium. This process condition is conducive to forming an $(Al_xGa_{1-x})_{0.5}In_{0.5}P$ layer 522 with a uniform thickness. In some implementations, the $(Al_xGa_{1-x})_{0.5}In_{0.5}P$ layer 522 is an unintentionally doped $(Al_xGa_{1-x})_{0.5}In_{0.5}P$ layer, thermal decomposition reaction of phosphine, TMGa, TMAl, and trimethylindium generates $(Al_xGa_{1-x})_{0.5}In_{0.5}P$ and a by-product carbon, and by controlling the process condition such as temperature, pressure, and V/III, the by-product carbon can be entered into the $(Al_xGa_{1-x})_{0.5}In_{0.5}P$ to generate unintentionally doped $(Al_xGa_{1-x})_{0.5}In_{0.5}P$. The unintentionally doped $(Al_xGa_{1-x})_{0.5}In_{0.5}P$ has weak absorption of carriers, thereby improving light-emitting efficiency.

Oxidation processing on the $Al_yGa_{1-y}As$ layer herein is the same as oxidation processing on the $Al_yGa_{1-y}As$ layer foregoing, which will not be repeated herein.

In other implementations, the electron blocking layer 52 is formed as follows. A carbon-doped $Al_yGa_{1-y}As$ layer is formed on the side of the first p-type waveguide sub-layer 51 away from the light-emitting layer 40 by introducing arsine, TMGa, TMAl, and a carbon precursor, where the carbon precursor includes tetrabromomethane or tetrachloromethane. An $(Al_xGa_{1-x})_{0.5}In_{0.5}P$ layer 522 is formed on one side of the $Al_yGa_{1-y}As$ layer away from the first p-type waveguide sub-layer 51 by introducing phosphine, TMGa, TMAl, and trimethylindium. Carbon-doped $Al_yGa_{1-y}As$ layers and $(Al_xGa_{1-x})_{0.5}In_{0.5}P$ layers 522 that are alternately stacked are formed on the side of the first p-type waveguide sub-layer 51 away from the light-emitting layer 40 by repeatedly and alternately forming the carbon-doped $Al_yGa_{1-y}As$ layers and the $(Al_xGa_{1-x})_{0.5}In_{0.5}P$ layers 522. The oxide layers of carbon-doped $Al_yGa_{1-y}As$ are formed by oxidizing the carbon-doped $Al_yGa_{1-y}As$ layers. The electron blocking layer 52 includes at least two oxide layers of carbon-doped $Al_yGa_{1-y}As$.

The carbon-doped $Al_yGa_{1-y}As$ layer is formed by introducing the carbon precursor as a p-type dopant, and the oxide layer of carbon-doped $Al_yGa_{1-y}As$ is formed by oxidizing the carbon-doped $Al_yGa_{1-y}As$ layer, such that the electron blocking layer 52 with the super-lattice structure can better realize hole transmission, thereby facilitating injection of holes into the light-emitting layer 40.

When the electron blocking layer 52 includes at least two oxide layers of carbon-doped $Al_yGa_{1-y}As$, each of the at least two oxide layers of carbon-doped $Al_yGa_{1-y}As$ has a thickness ranging from 1 nm to 5 nm. The thickness of the oxide layer of carbon-doped $Al_yGa_{1-y}As$ is a size of the oxide layer of carbon-doped $Al_yGa_{1-y}As$ in a direction parallel to a stacking direction. When the thickness of the oxide layer of carbon-doped $Al_yGa_{1-y}As$ is lower than 1 nm, the electron blocking layer 52 has a limited electron blocking effect. When the thickness of the oxide layer of carbon-doped $Al_yGa_{1-y}As$ is greater than 5 nm, the electron blocking layer

52 may block holes from injecting into the light-emitting layer 40, thereby decreasing light-emitting efficiency.

A value of x of $(Al_xGa_{1-x})_{0.5}In_{0.5}P$ satisfies $0.5 \le x \le 1.0$.

In some implementations, the electron blocking layer 52 includes 3 to 11 oxide layers of carbon-doped $Al_yGa_{1-y}As$ and 2 to 10 $(Al_xGa_{1-x})_{0.5}In_{0.5}P$ layers. The number of oxide layers of carbon-doped $Al_yGa_{1-y}As$ of the electron blocking layer 52 is one more than the number of $(Al_xGa_{1-x})_{0.5}In_{0.5}P$ layers 522 of the electron blocking layer 52. When the number of oxide layers of carbon-doped $Al_yGa_{1-y}As$ of the electron blocking layer 52 is less than 3, the electron blocking layer 52 has a limited electron blocking effect. When the number of oxide layers of carbon-doped $Al_y Ga_{1-y}As$ of the electron blocking layer 52 is greater than 11, the electron blocking layer 52 may block holes from injecting into the light-emitting layer 40, thereby decreasing light-emitting efficiency.

A condition for forming the carbon-doped $Al_yGa_{1-y}As$ layer herein, such as temperature, pressure, and V/III, is the same as that for forming the $Al_yGa_{1-y}As$ layer foregoing, which will not be repeated herein.

A condition for forming the $(Al_xGa_{1-x})_{0.5}In_{0.5}P$ layer 522 herein, such as temperature, pressure, and V/III, is the same as that for forming the $(Al_xGa_{1-x})_{0.5}In_{0.5}P$ layer 522 foregoing, which will not be repeated herein. In some implementations, the $(Al_xGa_{1-x})_{0.5}In_{0.5}P$ layer 522 is a not-intentionally doped $(Al_xGa_{1-x})_{0.5}In_{0.5}P$ layer, and the not-intentionally doped $(Al_xGa_{1-x})_{0.5}In_{0.5}P$ layer formed herein is the same as the $(Al_xGa_{1-x})_{0.5}In_{0.5}P$ layer formed foregoing, which will not be repeated herein.

Oxidation processing on the carbon-doped $Al_yGa_{1-y}As$ layer herein is the same as that on the $Al_yGa_{1-y}As$ layer foregoing, which will not be repeated herein.

In some implementations, in the operations at S105, forming the first p-type waveguide sub-layer 51 includes forming an $(Al_xGa_{1-x})_{0.5}In_{0.5}P$ layer on one side of the light-emitting layer 40 away from the n-type waveguide layer 30 by introducing phosphine, TMGa, TMAl, and trimethylindium.

A value of x of $(Al_xGa_{1-x})_{0.5}In_{0.5}P$ satisfies $0.5 \le x \le 1.0$.

A condition for forming the $(Al_xGa_{1-x})_{0.5}In_{0.5}P$ layer includes a temperature ranging from 680° C. to 730° C., a pressure ranging from 50 mbar to 80 mbar, and V/III ranging from 75 to 150, where V/III is a ratio of a gas flow of a group V source to a gas flow of a group III source, the group V source includes phosphine, and the group III source includes at least one of TMGa, TMAl, or trimethylindium. This process condition is conducive to forming an $(Al_x Ga_{1-x})_{0.5}In_{0.5}P$ layer with a uniform thickness. In some implementations, the $(Al_xGa_{1-x})_{0.5}In_{0.5}P$ layer is a not-intentionally doped $(Al_xGa_{1-x})_{0.5}In_{0.5}P$ layer, thermal decomposition reaction of phosphine, TMGa, TMAl, and trimethylindium generates $(Al_xGa_{1-x})_{0.5}In_{0.5}P$ and a by-product carbon, and by controlling the process condition such as temperature, pressure, and V/III, the by-product carbon can be entered into the $(Al_xGa_{1-x})_{0.5}In_{0.5}P$ to generate not-intentionally doped $(Al_xGa_{1-x})_{0.5}In_{0.5}P$. The not-intentionally doped $(Al_xGa_{1-x})_{0.5}In_{0.5}P$ has weak absorption of carriers, thereby improving light-emitting efficiency.

The first p-type waveguide sub-layer 51 formed has a refractive index lower than the light-emitting layer 40, such that total reflection of light beams emitted by the light-emitting layer 40 can occur at an intersection of the first p-type waveguide sub-layer 51 and the light-emitting layer 40, and thus the light beams can be intensively exited, thereby improving light extraction efficiency.

In some implementations, in the operations at S105, forming the second p-type waveguide sub-layer 53 includes forming an $(Al_xGa_{1-x})_{0.5}In_{0.5}P$ layer on one side of the electron blocking layer 52 away from the light-emitting layer 40 by pouring phosphine, TMGa, TMAl, and trimethylindium.

A value of x of $(Al_xGa_{1-x})_{0.5}In_{0.5}P$ satisfies $0.5 \le x \le 1.0$.

A condition for forming the $(Al_xGa_{1-x})_{0.5}In_{0.5}P$ layer herein, such as temperature, pressure, and V/III, is the same as that for forming the $(Al_xGa_{1-x})_{0.5}In_{0.5}P$ layer of the first p-type waveguide sub-layer, which will not be repeated herein. In some implementations, the $(Al_xGa_{1-x})_{0.5}In_{0.5}P$ layer of the second p-type waveguide sub-layer 53 is a not-intentionally doped $(Al_xGa_{1-x})_{0.5}In_{0.5}P$ layer, and the not-intentionally doped $(Al_xGa_{1-x})_{0.5}In_{0.5}P$ layer of the second p-type waveguide sub-layer 53 formed is the same as the $(Al_xGa_{1-x})_{0.5}In_{0.5}P$ layer of the first p-type waveguide sub-layer 51 formed foregoing, which will not be repeated herein.

In some implementations, the n-type confinement layer 20, the n-type waveguide layer 30, the light-emitting layer 40, and the p-type confinement layer 60 can be formed through metal-organic chemical vapor deposition (MOCVD), physical vapor deposition (PVD), or the like processes.

The n-type confinement layer 20 may be an AlInP layer, the p-type confinement layer 60 may be an AlInP layer, and each of the n-type confinement layer 20 and the p-type confinement layer 60 has a band gap greater than the light-emitting layer 40, such that holes and electrons can be confined in the light-emitting layer 40, and thus radiative recombination between the holes and the electrons can occur in the light-emitting layer 40.

The n-type waveguide layer 30 may be an $(Al_c Ga_{1-c})_{0.5}In_{0.5}P$ layer, where a value of c satisfies $0.5 \le c \le 1.0$. The n-type waveguide layer 30 has a refractive index lower than the light-emitting layer 40, such that total reflection of light beams emitted by the light-emitting layer 40 can occur at a place where the n-type waveguide layer 30 and the light-emitting layer 40 meet, and thus the light beams can be intensively exited, thereby improving light extraction efficiency.

In the implementation, the light-emitting layer 40 may be an MQW active layer, where the MQW active layer includes at least one potential barrier layer and at least one potential well layer that are alternately stacked. In some implementations, the potential barrier layer may be an $(Al_p Ga_{1-p})_{0.5}In_{0.5}P$ layer, and the potential well layer may be an $(Al_q Ga_{1-q})_{0.5}In_{0.5}P$ layer. The potential barrier layer has a band gap greater than the potential well layer, such that electrons and holes are confined in the potential well layer, and thus radiative recombination can occur.

Referring to FIG. 4 and FIG. 8 together, FIG. 8 is a flow chart illustrating a manufacturing method of an LED epitaxial structure provided in another implementation of the disclosure. As illustrated in FIG. 8, in some implementations, in the foregoing manufacturing method of an LED epitaxial structure, before the operations at S102 of forming the n-type confinement layer 20, the manufacturing method of an LED epitaxial structure further includes the following.

At S201, a buffer layer 11 is formed on the substrate.

At S202, an n-type ohmic contact layer 12 is formed on one side of the buffer layer 11 away from the substrate.

At S203, an n-type current spreading layer 13 is formed on one side of the n-type ohmic contact layer 12 away from the buffer layer 11.

The buffer layer 11, the n-type ohmic contact layer 12, and the n-type current spreading layer 13 can be formed through MOCVD, PVD, or the like processes.

The buffer layer 11 may be a GaAs layer, used to isolate and block defects and impurities on a surface of the substrate from entering into the n-type ohmic contact layer 12.

The n-type ohmic contact layer 12 may be an $(Al_a Ga_{1-a})_{0.5}In_{0.5}P$ layer used to form ohmic contact with an n electrode, where a value of a satisfies $0.3 \leq a \leq 0.6$.

The n-type current spreading layer 13 may be an $(Al_b Ga_{1-b})_{0.5}In_{0.5}P$ layer, where a value of b satisfies $0.5 \leq b \leq 1.0$. When a current flows through the n-type current spreading layer 13 to the light-emitting layer 40, the n-type current spreading layer 13 can make a density of a current reaching the light-emitting layer 40 uniform, where uniform current distribution can improve light-emitting efficiency.

Referring to FIG. 4 and FIG. 9 together, FIG. 9 is a flow chart illustrating a manufacturing method of an LED epitaxial structure provided in yet another implementation of the disclosure. As illustrated in FIG. 9, in some implementations, in the foregoing manufacturing method of an LED epitaxial structure, after the operations at S106 of forming the p-type confinement layer 60, the manufacturing method of an LED epitaxial structure further includes the following.

At S204, a transition layer 70 is formed on one side of the p-type confinement layer 60 away from the p-type waveguide layer 50.

At S205, a p-type current spreading layer 80 is formed on one side of the transition layer 70 away from the p-type confinement layer 60.

At S206, a p-type ohmic contact layer 90 is formed on one side of the p-type current spreading layer 80 away from the transition layer 70.

The transition layer 70, the p-type current spreading layer 80, and the p-type ohmic contact layer 90 can be formed through MOCVD, PVD, or the like processes.

The p-type current spreading layer 80 may be a GaP layer used to form ohmic contact with a p electrode.

The transition layer 70 may be an $(Al_fGa_{1-f})_{0.5}In_{0.5}P$ layer which is disposed between the p-type confinement layer 60 and the p-type current spreading layer 80 and functions as lattice transition, such that lattice mismatch between the p-type confinement layer 60 and the p-type current spreading layer 80 can be reduced, thereby reducing a defect density of the p-type current spreading layer 80.

The p-type ohmic contact layer 90 may be a GaP layer used to form ohmic contact with a p electrode.

To sum up, according to the manufacturing method of an LED epitaxial structure provided in implementations of the disclosure, the electron blocking layer 52 is formed, and the electron blocking layer 52 includes the oxide layer of $Al_yGa_{1-y}A$ 521, where aluminium oxide of an oxide of $Al_yGa_{1-y}A$ is a wide band material, such that an energy level difference between the electron blocking layer 52 and the light-emitting layer 40 is greater, and overflowing of electrons from the light-emitting layer 40 can be effectively blocked, thereby effectively improving light-emitting efficiency, a reverse-bias resistant property, and an antistatic ability of an LED device.

The manufacturing method of an LED epitaxial structure provided in the foregoing implementation corresponds to the LED epitaxial structure foregoing, and relevant parts can be cross referenced.

It is to be noted that, for the sake of simplicity, the foregoing method implementations are described as a series of action combinations. However, it will be appreciated by those skilled in the art that the disclosure is not limited by the sequence of actions described. According to the disclosure, some steps may be performed in other orders or simultaneously.

In the foregoing implementations, the description of each implementation has its own emphasis. For the parts not described in detail in one implementation, reference may be made to related descriptions in other implementations.

It is to be understood that the disclosure is not to be limited to the disclosed implementations. Those of ordinary skill in the art can make improvements or changes based on the above description, and all these improvements and changes should fall within the protection scope of the appended claims of this disclosure.

What is claimed is:

1. A light-emitting diode (LED) epitaxial structure, comprising an n-type confinement layer, an n-type waveguide layer, a light-emitting layer, a p-type waveguide layer, and a p-type confinement layer that are sequentially stacked, wherein the p-type waveguide layer comprises a first p-type waveguide sub-layer, an electron blocking layer, and a second p-type waveguide sub-layer that are sequentially stacked, wherein the first p-type waveguide sub-layer is disposed closer to the light-emitting layer than the second p-type waveguide sub-layer, and the electron blocking layer comprises at least two oxide layers of $aluminum_xgallium_{1-y}arsenide$ $(Al_yGa_{1-y}As)$ and at least one $(aluminum_xgallium_{1-x})_{0.5}indium_{0.5}phosphorus$ $(Al_x Ga_{1-x})_{0.5}In_{0.5}P)$ layer that are stacked, and the $(Al_x Ga_{1-x})_{0.5}In_{0.5}P$ layer and the oxide layers of $Al_yGa_{1-y}As$ are alternately stacked, and wherein the number of oxide layers of $Al_yGa_{1-y}As$ is one more than the number of $(Al_xGa_{1-x})_{0.5}In_{0.5}P$ layers, and two layers among the at least two oxide layers of $Al_yGa_{1-y}As$ are respectively disposed close to the first p-type waveguide sub-layer and the second p-type waveguide sub-layer.

2. The LED epitaxial structure of claim 1, wherein each of the two at least oxide layers of $Al_yGa_{1-y}As$ has a thickness ranging from 1 nm to 5 nm.

3. The LED epitaxial structure of claim 1, wherein the electron blocking layer comprises 3 to 11 oxide layers of $Al_yGa_{1-y}As$ and 2 to 10 $(Al_xGa_{1-x})_{0.5}In_{0.5}P$ layers.

4. The LED epitaxial structure of claim 1, wherein a value of y of an oxide of $Al_yGa_{1-y}As$ satisfies $0.5 \leq y \leq 1.0$.

5. The LED epitaxial structure of claim 1, wherein an oxide layer of the at least two oxide layers of $Al_yGa_{1-y}As$ comprises an oxide of carbon-doped $Al_yGa_{1-y}As$.

6. The LED epitaxial structure of claim 1, wherein a value of x of $(Al_x Ga_{1-x})_{0.5}In_{0.5}P$ satisfies $0.5 \leq x \leq 1.0$.

7. The LED epitaxial structure of claim 1, wherein the light-emitting layer is a multiple quantum well (MQW) active layer, wherein the MQW active layer comprises at least one potential barrier layer and at least one potential well layer that are alternately stacked.

8. A light-emitting diode (LED) device, comprising an n electrode, a p electrode, and an LED epitaxial structure comprising an n-type confinement layer, an n-type waveguide layer, a light-emitting layer, a p-type waveguide layer, and a p-type confinement layer that are sequentially stacked, wherein the p-type waveguide layer comprises a first p-type waveguide sub-layer, an electron blocking layer, and a second p-type waveguide sub-layer that are sequentially stacked, wherein the first p-type waveguide sub-layer is disposed closer to the light-emitting layer than the second p-type waveguide sub-layer, and the electron blocking layer comprises at least two oxide layers of aluminum$_y$gallium$_{1-y}$arsenide (Al$_y$Ga$_{1-y}$As) and at least one (aluminum$_x$gallium$_{1-x}$)$_{0.5}$indium$_{0.5}$phosphorus ((Al$_x$Ga$_{1-x}$)$_{0.5}$In$_{0.5}$P) layer that are stacked, and the (Al$_x$Ga$_{1-x}$)$_{0.5}$In$_{0.5}$P layer and the oxide layers of Al$_y$Ga$_{1-y}$As are alternately stacked, wherein the number of oxide layers of Al$_y$Ga$_{1-y}$As is one more than the number of (Al$_x$Ga$_{1-x}$)$_{0.5}$In$_{0.5}$Players, and two layers among the at least two oxide layers of Al$_y$Ga$_{1-y}$As are respectively disposed close to the first p-type waveguide sub-layer and the second p-type waveguide sub-layer, and wherein the n electrode is electrically coupled with the n-type confinement layer, and the p electrode is electrically coupled with the p-type confinement layer.

9. The LED device of claim 8, wherein each of the at least two oxide layers of Al$_y$Ga$_{1-y}$As has a thickness ranging from 1 nm to 5 nm.

10. The LED device of claim 8, wherein the electron blocking layer comprises 3 to 11 oxide layers of Al$_y$Ga$_{1-y}$As and 2 to 10 (Al$_x$Ga$_{1-x}$)$_{0.5}$In$_{0.5}$P layers.

11. The LED device of claim 8, wherein a value of y of an oxide of Al$_y$Ga$_{1-y}$As satisfies 0.5≤y≤1.0.

12. The LED device of claim 8, wherein an oxide layer of the two oxide layers of Al$_y$Ga$_{1-y}$As comprises an oxide of carbon-doped Al$_y$Ga$_{1-y}$As.

13. The LED device of claim 8, wherein a value of x of (Al$_x$Ga$_{1-x}$)$_{0.5}$In$_{0.5}$P satisfies 0.5≤x≤1.0.

14. The LED device of claim 8, wherein the light-emitting layer is a multiple quantum well (MQW) active layer, wherein the MQW active layer comprises at least one potential barrier layer and at least one potential well layer that are alternately stacked.

15. A manufacturing method of a light-emitting diode (LED) epitaxial structure, comprising:

providing a substrate;

forming an n-type confinement layer on the substrate;

forming an n-type waveguide layer on one side of the n-type confinement layer away from the substrate;

forming a light-emitting layer on one side of the n-type waveguide layer away from the n-type confinement layer;

forming a p-type waveguide layer on one side of the light-emitting layer away from the n-type waveguide layer, wherein forming the p-type waveguide layer comprises forming, on one side of the light-emitting layer away from the n-type waveguide layer, a first p-type waveguide sub-layer, an electron blocking layer, and a second p-type waveguide sub-layer that are sequentially stacked, and the electron blocking layer comprises at least two oxide layers of aluminum$_y$gallium$_{1-y}$arsenide (Al$_y$Ga$_{1-y}$As); and forming a p-type confinement layer on one side of the p-type waveguide layer away from the light-emitting layer, wherein forming the electron blocking layer comprises:

forming an Al$_y$Ga$_{1-y}$As layer on one side of the first p-type waveguide sub-layer away from the light-emitting layer by introducing arsine, trimethylgallium (TMGa), and trimethylaluminium (TMAl);

forming an (aluminum$_x$gallium$_{1-x}$)$_{0.5}$indium$_{0.5}$phosphorus(Al$_x$Ga$_{1-x}$)$_{0.5}$In$_{0.5}$P) layer on one side of the Al$_y$Ga$_{1-y}$As layer away from the first p-type waveguide sub-layer by introducing phosphine, TMGa, TMAl, and trimethylindium;

forming, on the side of the first p-type waveguide sub-layer away from the light-emitting layer, Al$_y$Ga$_{1-y}$As layers and (Al$_x$Ga$_{1-x}$)$_{0.5}$In$_{0.5}$P layers that are alternately stacked by repeatedly and alternately forming the Al$_y$Ga$_{1-y}$As layers and the (Al$_x$Ga$_{1-x}$)$_{0.5}$In$_{0.5}$P layers; and forming the oxide layers of Al$_y$Ga$_{1-y}$As by oxidizing the Al$_y$Ga$_{1-y}$As layers.

16. The manufacturing method of an LED epitaxial structure of claim 15, wherein forming the Al$_y$Ga$_{1-y}$As layer on the side of the first p-type waveguide sub-layer away from the light-emitting layer by introducing arsine, TMGa, and TMAl comprises:

forming a carbon-doped Al$_y$Ga$_{1-y}$As layer on the side of the first p-type waveguide sub-layer away from the light-emitting layer by introducing arsine, TMGa, TMAl, and a carbon precursor, wherein the carbon precursor comprises tetrabromomethane or tetrachloromethane.

* * * * *